(12) United States Patent
Kishimura et al.

(10) Patent No.: US 7,588,876 B2
(45) Date of Patent: *Sep. 15, 2009

(54) RESIST MATERIAL AND PATTERN FORMATION METHOD

(75) Inventors: Shinji Kishimura, Hyogo (JP); Masayuki Endo, Osaka (JP); Masaru Sasago, Osaka (JP); Mitsuru Ueda, Tokyo (JP); Hirokazu Imori, Aichi (JP); Toshiaki Fukuhara, Kanagawa (JP)

(73) Assignee: Panasonic Corporation, Osaka (JP)

( * ) Notice: Subject to any disclaimer, the term of this patent is extended or adjusted under 35 U.S.C. 154(b) by 379 days.

This patent is subject to a terminal disclaimer.

(21) Appl. No.: 11/128,441

(22) Filed: May 13, 2005

(65) Prior Publication Data

US 2005/0266338 A1    Dec. 1, 2005

(30) Foreign Application Priority Data

May 25, 2004  (JP)  ............................. 2004-154293
Apr. 26, 2005  (JP)  ............................. 2005-128266

(51) Int. Cl.
*G03F 7/004* (2006.01)
*C08F 12/30* (2006.01)

(52) U.S. Cl. .................... 430/270.1; 430/326; 430/905; 430/907; 526/288

(58) Field of Classification Search .............. 430/270.1, 430/326, 905, 907; 526/288
See application file for complete search history.

(56) References Cited

U.S. PATENT DOCUMENTS 4,491,628 A    1/1985 Ito et al.

(Continued)

FOREIGN PATENT DOCUMENTS

EP    0 330 239 A2    8/1989

(Continued)

OTHER PUBLICATIONS

Fukuhara, Toshiaki., et al. "Synthesis of Poly[N-(1-asamantyl methacrylate] for 193 nm Lithography." Macromolecules, Apr. 19, 2005, vol. 38, No. 8, XP 002346321, pp. 3041-3043.

(Continued)

*Primary Examiner*—Cynthia H Kelly
*Assistant Examiner*—Anca Eoff
(74) *Attorney, Agent, or Firm*—McDermott Will & Emery LLP

(57) ABSTRACT

A resist material includes a base polymer containing a compound having a unit represented by a general formula of the following Chemical Formula 1:

Chemical Formula 1:

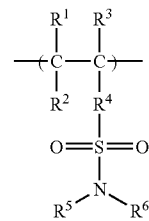

wherein $R^1$, $R^2$ and $R^3$ are the same or different and are a hydrogen atom, a fluorine atom, a straight-chain alkyl group, a branched or cyclic alkyl group or a fluoridated alkyl group with a carbon number not less than 1 and not more than 20; $R^4$ is a straight-chain alkylene group or a branched or cyclic alkylene group with a carbon number not less than 0 and not more than 20; $R^5$ is a hydrogen atom, a straight-chain alkyl group, a branched or cyclic alkyl group or a fluoridated alkyl group with a carbon number not less than 1 and not more than 20, or a protecting group released by an acid; and $R^6$ is a group having a cyclic ester compound, a group having an alicyclic compound including a hydroxyl group or a group having a compound including hexafluoroisopropyl alcohol.

17 Claims, 3 Drawing Sheets

U.S. PATENT DOCUMENTS

| | | | |
|---|---|---|---|
| 5,310,619 | A | 5/1994 | Crivello et al. |
| 5,362,607 | A | 11/1994 | Crivello et al. |
| 6,596,458 | B1 | 7/2003 | Sato et al. |
| 7,060,775 | B2 * | 6/2006 | Kishimura et al. ........... 526/288 |
| 7,166,418 | B2 * | 1/2007 | Kishimura et al. .......... 430/325 |
| 7,169,530 | B2 * | 1/2007 | Kishimura et al. ....... 430/270.1 |
| 2005/0147915 | A1 * | 7/2005 | Dammel .................. 430/270.1 |
| 2005/0202340 | A1 * | 9/2005 | Houlihan et al. ......... 430/270.1 |
| 2007/0099117 | A1 * | 5/2007 | Kishimura et al. ....... 430/270.1 |

FOREIGN PATENT DOCUMENTS

| | | |
|---|---|---|
| EP | 0 731 388 A2 | 9/1996 |
| EP | 0 814 381 A1 | 12/1997 |
| EP | 1 517 181 A1 | 3/2005 |
| JP | 63-027829 | 2/1988 |
| JP | 02-027660 | 6/1990 |
| JP | 09-073173 | 3/1997 |
| JP | 09-230595 | 9/1997 |
| JP | 10-010739 A | 1/1998 |
| JP | 2000-330289 | 11/2000 |
| JP | 2002-250215 A | 9/2002 |
| WO | WO 97/33198 | 9/1997 |
| WO | WO 00/46268 | 8/2000 |

OTHER PUBLICATIONS

Fujigaya et al., "A New Photoresist Material for 157 nm Lithography-2"; *Journal of Photopolymer Science and Technology*; c. 2002; pp. 643-654; vol. 15, No. 4.

* cited by examiner

RESIST MATERIAL AND PATTERN FORMATION METHOD

CROSS-REFERENCE TO RELATED APLICATIONS

This application claims priority under 35 U.S.C. §119 on Patent Application No. 2004-154293 filed in Japan on May 25, 2004 and No. 2005-128266 filed in Japan on Apr. 26, 2005, the entire contents of which are hereby incorporated by reference.

BACKGROUND OF THE INVENTION

The present invention relates to a resist material or a chemically amplified resist material suitably used in refinement technique and a pattern formation method using the resist material.

In accordance with recent increase of the degree of integration and the operation speed of an LSI, there are increasing demands for refinement of an interconnect pattern rule.

The refinement of the interconnect pattern rule has been rapidly developed because of increased NA of a projection lens, improved performance of a resist material, a reduced wavelength of exposing light and the like.

With respect to increase of resolution and sensitivity of a resist material, a positive chemically amplified resist material using, as a catalyst, an acid generated through irradiation with exposing light exhibits high performance and hence has become a leading resist material particularly in the field of deep UV lithography (see Japanese Patent Publication No. 2-27660 and Japanese Laid-Open Patent Publication No. 63-27829).

Also, reduction of the wavelength of the exposing light from i line (of a wavelength of a 365 nm band) to KrF excimer laser (of a wavelength of a 248 nm band) has brought a large technical innovation, and a resist material for the KrF excimer laser was applied to 0.30 µm process at first and to a 0.18 µm rule in the course of time and is now applied to mass-production employing a 0.15 µm rule.

Furthermore, a 0.13 µm rule has already been studied. Thus, the speed for development in the refinement has been increasing, and hence, it is necessary to further improve transparency and substrate adhesiveness of a resist material.

It is expected that the design rule can be further refined to 90 nm or less by using ArF excimer laser (of a wavelength of a 193 nm band) as the exposing light. However, a conventionally used resin such as a Novolac resin or a poly(vinylphenol)-based resin has strong absorption in the vicinity of the wavelength of the 193 nm band, and hence cannot be used as a base polymer for a resist film in this case.

Therefore, for attaining transparency and dry etching resistance, use of an acrylic resin or a cycloolefin-based alicyclic resin as a base polymer has been examined (see Japanese Laid-Open Patent Publication Nos. 9-73173, 10-10739 and 9-230595 and International Bureau pamphlet numbered WO97/33198).

The other references related to the background of the invention are Japanese Laid-Open Patent Publication Nos. 2000-330289 and 2002-250215; and Tsuyohiko FUJIGAYA, Shinji ANDO, Yuji SHIBASAKI, Mitsuru UEDA, Shinji KISHIMURA, Masayuki ENDO and Masaru SASAGO, "New Photoresist Material for 157 nm Lithography-2", J. Photopolym. Sci. Technol., 15(4), 643-654 (2002).

An acrylic resin has, however, a problem that a resultant resist pattern is in a poor shape when it is used as a base polymer because it swells in development, and an alicyclic resin has a problem that solubility in a developer and substrate adhesiveness are degraded when it is used as a base polymer because it has a strong hydrophobic property.

On the other hand, $F_2$ laser (of a wavelength of a 157 nm band) is expected to attain refinement of the design rule to approximately 65 nm or less, but it is difficult to attain sufficient transparency of a base polymer. It has been found that an acrylic resin that is used as a base polymer in using ArF excimer laser does not transmit the $F_2$ laser at all, and that a cycloolefin-based resin having a carbonyl bond has strong absorption against the $F_2$ laser. Furthermore, poly(vinylphenol), which is used as a base polymer in using KrF excimer laser, has an absorption window (namely, a region that has high transparency because exposing light is not absorbed therein) in the vicinity of a wavelength of a 160 nm band, and hence the transmittance is slightly improved when it is used, but it has been found that the transmittance is still far from practical level (that is, transmittance of 40% or more).

SUMMARY OF THE INVENTION

In consideration of the aforementioned conventional problems, an object of the invention is providing a resist material and more specifically a chemically amplified resist material that has high transmittance against exposing light of a wavelength of a 200 nm band, and in particular, deep UV such as KrF laser (of a wavelength of a 248 nm band) or ArF laser (of a wavelength of a 193 nm band) or vacuum UV such as $F_2$ laser (of a wavelength of a 157 nm band), $Kr_2$ laser (of a wavelength of a 146 nm band), KrAr laser (of a wavelength of a 134 nm band) or $Ar_2$ laser (of a wavelength of a 126 nm band), is good at substrate adhesiveness, does not swell in development and exhibits high solubility in a developer; and a pattern formation method using the resist material.

As described above, since a carbonyl group or a double bond of carbon has absorption in the vicinity of the 157 nm band, it seems to be one effective method for improving the transmittance to reduce such a unit.

Furthermore, it has been found through recent study that transparency is remarkably improved in the vicinity of the 157 nm band by introducing a fluorine atom into a base polymer. Actually, a polymer in which fluorine is introduced into an aromatic ring of poly(vinylphenol) attains transmittance at almost practical level.

It has been found, however, that such a base polymer has high transparency against $F_2$ laser but is difficult to practically use in a resist material because a negative reaction is largely proceeded through irradiation with the laser.

Also, it has been found that an acrylic polymer or a polymer in which fluorine is introduced into a polymer compound having, on a main chain, an aliphatic cyclic compound obtained from a norbornene derivative has high transparency and is free from the negative reaction. However, it has been also found that the substrate adhesiveness and solubility in a developer of a resist film tend to be degraded when the introducing rate of fluorine is increased for further improving the transparency.

The present inventors have earnestly made examination for achieving the object, and as a result, have found that a resist material and more particularly a chemically amplified resist material that is good at transparency of a resultant resist film against an exposing light source, has high substrate adhesiveness, does not swell in development and exhibits high solubility in a developer can be obtained when a base polymer includes, on a side chain of a unit including vinyl sulfonamide, a group having a cyclic ester compound, a group having an alicyclic compound including a hydroxyl group or a group having a compound including hexafluoroisopropyl alcohol.

Specifically, a base polymer that contains a unit including vinyl sulfonamide having a sulfonamide group on a side chain and further includes, on the side chain thereof, a group having a cyclic ester compound, a group having an alicyclic compound including a hydroxyl group or a group having a compound including hexafluoroisopropyl alcohol has been found to have high transparency against exposing light of a wavelength of a 300 nm band or less although it includes two sulfur-oxygen double bonds.

When a group having a cyclic ester compound, a group having an alicyclic compound including a hydroxyl group or a group having a compound including hexafluoroisopropyl alcohol is introduced into a side chain of the unit including vinyl sulfonamide, a base polymer can be constructed without particularly utilizing a carbonyl group on the side chain. Accordingly, since the base polymer can be constructed without using a carbonyl group, which has a high absorbing characteristic against exposing light of a wavelength of a 200 nm band in particular, the transparency of a resultant resist film against exposing light of a shorter wavelength band can be secured.

Furthermore, it has been found that, in a resist film made of the base polymer containing, on the side chain of the unit including the vinyl sulfonamide compound, a group having a cyclic ester compound, a group having an alicyclic compound including a hydroxyl group or a group having a compound including hexafluoroisopropyl alcohol, the substrate adhesiveness and the solubility in a developer are remarkably improved as compared with those in a resist film including, as a base polymer, a fluorine-containing polymer.

The base polymer according to this invention includes a sulfonamide group on a side chain, and furthermore, a group having a cyclic ester compound, a group having an alicyclic compound including a hydroxyl group or a group having a compound including hexafluoroisopropyl alcohol is bonded to the sulfonamide group.

In a sulfonamide group, an oxygen atom with a strong negative property and large polarity and a sulfur atom are bonded through a double bond and a nitrogen atom that can easily attain a positive property is bonded to the sulfur atom, and hence, free electrons on the oxygen atom not related to the bond to the sulfur atom are present in a delocalized state. Therefore, when the unit including vinyl sulfonamide is used as the base polymer, a portion of the base polymer corresponding to the sulfonamide group exhibits strong polarity, and hence, electronic interaction is easily caused between the sulfonamide group and a substrate particularly in the case where the underlying substrate is made of an inorganic material, or strong interaction is caused between the sulfonamide group and an alkaline group included in a developer. As a result, the substrate adhesiveness of the resist film is improved and reactivity of an exposed portion with the developer is improved.

Furthermore, it has been found that when the base polymer includes a sulfonamide group, the swell of a resultant resist can be suppressed.

A conventional acrylic resist material includes, on the side chain, a unit that is changed into a carboxylic acid group through exposure as a unit for causing a reaction with the developer. In a carboxylic acid group, a H atom and an O atom interacts with each other through a hydrogen bond as shown in Chemical Formula 13 below, and hence, the carboxylic acid group tends to form a hexagonal structure in which two molecules oppose each other. Since electrons form an octet in this hexagonal structure, the structure is stereo-chemically stable. When bonds having such a structure are generated in various portions of the base polymer after the exposure, three-dimensional bonds tend to be formed between the side chains of the polymer, and hence the polymer is easily formed in a mesh structure. As a result, the resist film swells.

Chemical Formula 13:

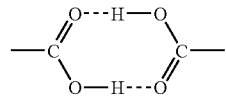

On the other hand, the resist material of this invention includes a unit including a sulfonamide group on a side chain as a unit for causing a reaction with a developer after the exposure. In a sulfonamide group, bonds mutually easily coupled cannot be formed owing to its structure differently from a carboxylic acid group. Therefore, even when the unit that can react with a developer is formed after the exposure, the terminal groups of the base polymer minimally form three-dimensional bonds, and a mesh structure is minimally formed. As a result, the swell of the resist film can be suppressed.

In addition, when a group having a cyclic ester compound, a group having an alicyclic compound including a hydroxyl group or a group having a compound including hexafluoroisopropyl alcohol is bonded to the sulfonamide group, the resist characteristic can be improved.

Specifically, in using a cyclic ester compound, the etching resistance of the resultant resist pattern attained after the exposure can be improved owing to its large steric structure. Also, in using an alicyclic compound including a hydroxyl group, since a hydroxyl group with high polarity is bonded to the terminal portion of the compound, it is easily interacted with another polar group, and hence, the improvement in the adhesiveness can be accelerated. Also, in using a compound including hexafluoroisopropyl alcohol, since it has a plurality of $CF_3$ groups and hydroxyl groups in terminal portions thereof, the transparency of the resultant resist film against exposing light is improved, and hence, the adhesiveness of the resist film to the substrate is improved. In other words, since there exist a plurality of F atoms, the absorption peak of the exposing light of a resist film having a structure in which F atoms are not substituted is shifted, and hence, the initial absorption band of the exposing light is shifted so that the transparency of the resist material against the wavelength of the exposing light can be improved. In addition, owing to the hydroxyl group present at a terminal portion of the base polymer, chemical interaction is easily caused between the resist film and a material of an underlying film, resulting in improving the adhesiveness.

The present invention was devised on the basis of the aforementioned findings, and is specifically practiced as follows:

The resist material of this invention includes a base polymer containing a compound including a unit represented by a general formula of the following Chemical Formula 14:

Chemical Formula 14:

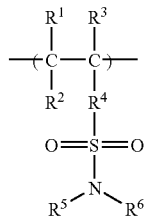

wherein $R^1$, $R^2$ and $R^3$ are the same or different and are a hydrogen atom, a fluorine atom, a straight-chain alkyl group, a branched or cyclic alkyl group or a fluoridated alkyl group with a carbon number not less than 1 and not more than 20; $R^4$ is a straight-chain alkylene group or a branched or cyclic alkylene group with a carbon number not less than 0 and not more than 20; $R^5$ is a hydrogen atom, a straight-chain alkyl group, a branched or cyclic alkyl group or a fluoridated alkyl group with a carbon number not less than 1 and not more than 20, or a protecting group released by an acid; and $R^6$ is a group having a cyclic ester compound, a group having an alicyclic compound including a hydroxyl group or a group having a compound including hexafluoroisopropyl alcohol.

The resist material of this invention includes the base polymer having a sulfonamide group on the side chain of the unit, and hence, a sulfur atom included in the sulfonamide group has positive polarity while an oxygen atom included in the sulfonamide group has negative polarity. Therefore, the unit having the sulfonamide group has a high hydrophilic property. Also, in the resist material of this invention, the group having a cyclic ester compound, the group having an alicyclic compound including a hydroxyl group or the group having a compound including hexafluoroisopropyl alcohol is bonded to the sulfonamide group present on the side chain of the base polymer. Accordingly, the etching resistance, the resultant resist film is improved in the adhesiveness and the transparency owing to a plurality of $CF_3$ groups.

As the group having a cyclic ester compound, the group having an alicyclic compound including a hydroxyl group or the group having a compound including hexafluoroisopropyl alcohol used in the resist material of this invention, any of specific examples described in embodiments below can be used.

In the resist material of this invention, the base polymer preferably further includes an acid generator for generating an acid through irradiation with light. Thus, a positive chemically amplified resist material having the aforementioned effect can be realized.

In the resist material of this invention, the base polymer preferably further includes a dissolution inhibitor for inhibiting dissolution of the base polymer. Thus, the dissolution contrast of the resultant resist film can be improved.

In the resist material of this invention, the protecting group released by an acid is preferably an acetal group.

Thus, since an acetal group includes an ether bond and has an unpaired electron pair on an oxygen atom, it has high reactivity with an acid. In other words, it needs smaller activation energy for reacting with an acid. Therefore, the protecting group of the acetal group can be easily released by an acid. A sulfonamide compound including an acetal protecting group can be obtained, for example, by reacting a sulfonamide compound with a vinyl ether compound or methyl ether halide.

In the resist material of this invention, the acetal group is preferably an alkoxyethyl group or an alkoxymethyl group.

Examples of the alkoxyethyl group are an adamantyloxyethyl group, a t-butyloxyethyl group, an ethoxyethyl group and a methoxyethyl group. For example, an adamantyloxyethyl group can be obtained by reacting a sulfonamide compound with vinyl adamantane ether.

Examples of the alkoxymethyl group are an adamantyloxymethyl group, a t-butyloxymethyl group, an ethoxymethyl group and a methoxymethyl group. For example, an adamantyloxymethyl group can be obtained by reacting a sulfonamide compound with chloromethyl adamantane ether.

The first pattern formation method of this invention includes the steps of forming a resist film containing a base polymer including a compound having a unit represented by a general formula of the following Chemical Formula 15; performing pattern exposure by selectively irradiating the resist film with exposing light of high energy beams of a wavelength not shorter than a 100 nm band and not longer than a 300 nm band or not shorter than a 1 nm band and not longer than a 30 nm band or electron beams; and forming a resist pattern by developing the resist film after the pattern exposure:

Chemical Formula 15:

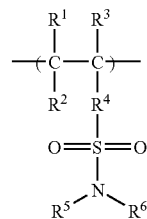

wherein $R^1$, $R^2$ and $R^3$ are the same or different and are a hydrogen atom, a fluorine atom, a straight-chain alkyl group, a branched or cyclic alkyl group or a fluoridated alkyl group with a carbon number not less than 1 and not more than 20; $R^4$ is a straight-chain alkylene group or a branched or cyclic alkylene group with a carbon number not less than 0 and not more than 20; $R^5$ is a hydrogen atom, a straight-chain alkyl group, a branched or cyclic alkyl group or a fluoridated alkyl group with a carbon number not less than 1 and not more than 20, or a protecting group released by an acid; and $R^6$ is a group having a cyclic ester compound, a group having an alicyclic compound including a hydroxyl group or a group having a compound including hexafluoroisopropyl alcohol.

The second pattern formation method of this invention includes the steps of forming a resist film containing a base polymer including a compound having a unit represented by a general formula of the following Chemical Formula 16; providing a liquid onto the resist film; performing pattern exposure by selectively irradiating the resist film with exposing light of high energy beams of a wavelength not shorter than a 100 nm band and not longer than a 300 nm band or not shorter than a 1 nm band and not longer than a 30 nm band or electron beams; and forming a resist pattern by developing the resist film after the pattern exposure:

Chemical Formula 16:

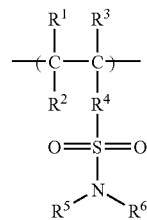

wherein $R^1$, $R^2$ and $R^3$ are the same or different and are a hydrogen atom, a fluorine atom, a straight-chain alkyl group, a branched or cyclic alkyl group or a fluoridated alkyl group with a carbon number not less than 1 and not more than 20; $R^4$ is a straight-chain alkylene group or a branched or cyclic alkylene group with a carbon number not less than 0 and not more than 20; $R^5$ is a hydrogen atom, a straight-chain alkyl group, a branched or cyclic alkyl group or a fluoridated alkyl group with a carbon number not less than 1 and not more than 20, or a protecting group released by an acid; and $R^6$ is a group having a cyclic ester compound, a group having an alicyclic compound including a hydroxyl group or a group having a compound including hexafluoroisopropyl alcohol.

As the group having a cyclic ester compound, the group having an alicyclic compound including a hydroxyl group or the group having a compound including hexafluoroisopropyl alcohol used in the first or second pattern formation method of this invention, any of specific examples described in the embodiments below can be used.

In the first or second pattern formation method of this invention, the base polymer includes, on the side chain of the unit, the sulfonamide group and the group having a cyclic ester compound, the group having an alicyclic compound including a hydroxyl group or the group having a compound including hexafluoroisopropyl alcohol bonded to the sulfonamide group.

In this case, a sulfur atom included in the sulfonamide group has positive polarity while an oxygen atom included in the sulfonamide group has negative polarity. Therefore, the unit having the sulfonamide group has a high hydrophilic property. Also, the etching resistance and the substrate adhesiveness of the resultant resist film can be improved owing to the group having a cyclic ester compound, the group having an alicyclic compound including a hydroxyl group or the group having a compound including hexafluoroisopropyl group. Furthermore, the resist film is free from swelling and is good at developer solubility, and hence, the resist pattern can be formed in a good shape. Also, since the base polymer has the sulfonamide group on the side chain of the unit, although it includes two sulfur-oxygen double bonds, it has high transmittance against exposing light of a wavelength not longer than a 300 nm band. Moreover, the improvement in the transparency can be accelerated owing to F atoms derived from the hexafluoroisopropyl alcohol.

In particular, in the second pattern formation method, the step of performing the pattern exposure is carried out by employing immersion lithography, and hence, the resolution of the resist film is improved. In the immersion lithography, a region between a condensing lens and a resist film formed on a wafer in an exposure system is filled with a liquid having a refractive index higher than that of the air. Thus, theoretically, the NA (numerical aperture of a lens) of the exposure system can be increased to the refractive index of the liquid at its best, resulting in improving the resolution of the resist film. Also, the focal depth can be increased by this method.

Specific effects obtained in this invention are as follows: Since the base polymer of the resist material has a sulfonamide group on the side chain in this invention, high resolution can be attained by employing the immersion lithography in particular. In a sulfonamide group, an oxygen atom having a strong negative property and large polarity and a sulfur atom are bonded through a double bond and a nitrogen atom that easily attains a positive polarity is bonded to the sulfur atom. Therefore, free electrons on the oxygen atom not related to the bond with the sulfur atom are present in a delocalized state. In other words, the sulfonamide group is a substituent group having high polarity, and therefore, when the base polymer includes a vinyl sulfonamide unit as in this invention, there are a plurality of sulfonamide groups on the side chain. Accordingly, electronic interaction (chemical interaction) is caused between an oxygen atom having a strong negative property of a sulfonamide group bonded to a side chain of one base polymer and a nitrogen atom having a strong positive property of a sulfonamide group bonded to a side chain of another base polymer, resulting in causing strong interaction between the base polymers included in the resist film.

Accordingly, even when the liquid is provided on the resist film in the exposure employing the immersion lithography, the strong interaction caused within the resist film brings a force for mutually holding substances included in the resist film. Therefore, a substance included in the resist film is minimally eluted from the resist film into the liquid. Also, the substituent groups are already bonded to one another through the chemical interaction within the base polymer included in the resist film, interaction is minimally caused between constituting molecules of the liquid employed in the exposure by the immersion lithography and the base polymer. Therefore, the liquid can be prevented from invading the resist film. As a result, high resolution peculiar to the exposure by the immersion lithography can be kept and the solubility in a developer can be high, so that stable pattern formation can be carried out.

In the first or second pattern formation method of this invention, the base polymer preferably further includes an acid generator for generating an acid through irradiation with light. Thus, the base polymer functions as a chemically amplified resist. In this manner, the protecting group of the base polymer is released by an acid generated through irradiation with light, so as to attain solubility in a developer.

In the first or second pattern formation method of this invention, the base polymer including an acid generator, namely, a chemically amplified resist, preferably further includes a dissolution inhibitor for inhibiting dissolution of the base polymer. Thus, the dissolution contrast of the resist film can be improved.

In the first or second pattern formation method of this invention, the protecting group released by an acid is preferably an acetal group.

Thus, since an acetal group includes an ether bond and has an unpaired electron pair on an oxygen atom, it has high reactivity with an acid. In other words, it needs smaller activation energy for reacting with an acid. Therefore, the protecting group of the acetal group can be easily released by an acid. A sulfonamide compound including an acetal protecting group can be obtained, for example, by reacting a sulfonamide compound with a vinyl ether compound or methyl ether halide.

In the first or second pattern formation method of this invention, the acetal group is preferably an alkoxyethyl group or an alkoxymethyl group.

Examples of the alkoxyethyl group are an adamantyloxyethyl group, a t-butyloxyethyl group, an ethoxyethyl group and a methoxyethyl group. For example, an adamantyloxyethyl group can be obtained by reacting a sulfonamide compound with vinyl adamantane ether.

Examples of the alkoxymethyl group are an adamantyloxymethyl group, a t-butyloxymethyl group, an ethoxymethyl group and a methoxymethyl group. For example, an adamantyloxymethyl group can be obtained by reacting a sulfonamide compound with chloromethyl adamantane ether.

In the second pattern formation method of this invention, the liquid may be water or perfluoropolyether.

In the first or second pattern formation method of this invention, the exposing light may be KrF laser, ArF laser, $F_2$ laser, $Kr_2$ laser, KrAr laser, $Ar_2$ laser or soft X-rays.

In the first or second pattern formation method of this invention, the base polymer preferably has a trifluoromethyl group on a side chain thereof.

In this manner, according to this invention, the resist material including a group having a cyclic ester compound, a group having an alicyclic compound including a hydroxyl group or a group having a compound including hexafluoroisopropyl alcohol bonded to a sulfonamide group attains high hydrophilic property owing to the sulfonamide group present on the side chain. Therefore, the substrate adhesiveness of a resultant resist film can be improved, and the resist film is free from swelling and is good at solubility in a developer, and hence, a resultant resist pattern is formed in a good shape. Also, since the base polymer has the sulfonamide group on the side chain, it has high transmittance against exposing light of a wavelength not longer than a 300 nm band. Moreover, since the group having a cyclic ester compound, the group having an alicyclic compound including a hydroxyl group or the group having a compound including hexafluoroisopropyl alcohol is bonded to the sulfonamide group, the etching resistance of the resist material can be improved and the improvement in the substrate adhesiveness and the transparency can be accelerated.

DETAILED DESCRIPTION OF THE INVENTION

Embodiment 1

Figure 1A:
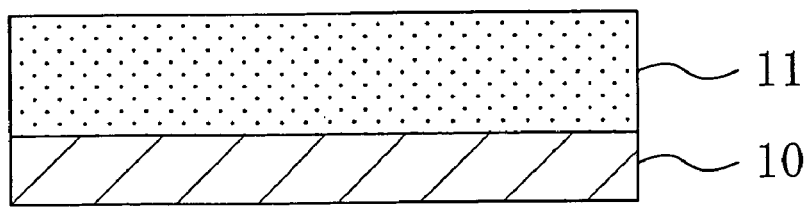
FIGS. 1A, 1B, 1C and 1D are cross-sectional views for showing procedures in a pattern formation method of Example 1 for embodying Embodiment 2 of the invention.

A resist material according to Embodiment 1 of the invention will now be described.

The resist material of Embodiment 1 includes, as a base polymer, a polymer compound including a unit represented by a general formula of Chemical Formula 17 below. The weight average molecular weight of the polymer compound is preferably not less than 2,000 and not more than 100,000.

The resist material of Embodiment 1 may further include another polymer compound for the purpose of changing dynamical, thermal or other properties of a resultant film. In this case, the polymer compound to be further included is not particularly specified, and such an additional polymer compound is preferably included so that the proportion of the polymer compound including the unit represented by the general formula of Chemical Formula 17 can be not less than 50% and not more than 70% of the whole base polymer.

Chemical Formula 17:

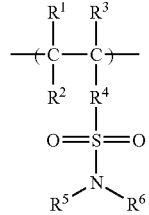

wherein $R^1$, $R^2$ and $R^3$ are the same or different and are a hydrogen atom, a fluorine atom, a straight-chain alkyl group, a branched or cyclic alkyl group or a fluoridated alkyl group with a carbon number not less than 1 and not more than 20; $R^4$ is a straight-chain alkylene group or a branched or cyclic alkylene group with a carbon number not less than 0 and not more than 20; $R^5$ is a hydrogen atom, a straight-chain alkyl group, a branched or cyclic alkyl group or a fluoridated alkyl group with a carbon number not less than 1 and not more than 20, or a protecting group released by an acid; and $R^6$ is a group having a cyclic ester compound, a group having an alicyclic compound including a hydroxyl group or a group having a compound including hexafluoroisopropyl alcohol.

First, the group having a cyclic ester compound, the group having an alicyclic compound including a hydroxyl group or the group having a compound including hexafluoroisopropyl alcohol, that is, the substituent group $R^6$ used in the polymer compound including the unit represented by the general formula of Chemical Formula 17, will be described.

Specific examples of the group having a cyclic ester compound are groups shown in Chemical Formula 18 below.

Chemical Formula 18:

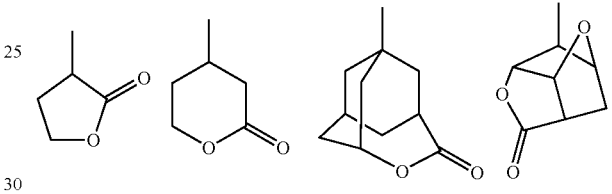

A specific example of the group having an alicyclic compound including a hydroxyl group is a group shown in Chemical Formula 19 below.

Chemical Formula 19:

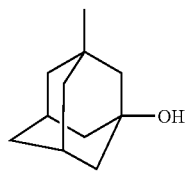

Specific examples of the group having a compound including hexafluoroisopropyl alcohol are groups shown in Chemical Formula 20 below.

Chemical Formula 20:

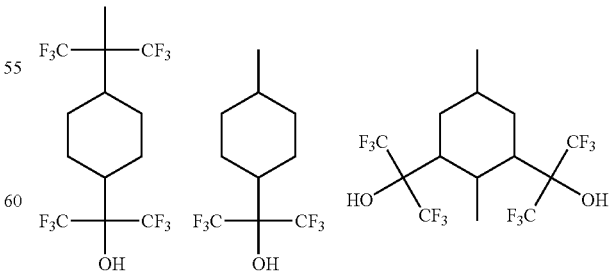

Also, in the polymer compound including the unit represented by the general formula of Chemical Formula 17, specific examples of the straight-chain alkyl group or the branched or cyclic alkyl group with a carbon number not less than 1 and not more than 20 are a methyl group, an ethyl group, a propyl group, an isopropyl group, a n-propyl group, a n-butyl group, a sec-butyl group, a tert-butyl group, a cyclopentyl group, a cyclohexyl group, a cyclohexylmethyl group, a 2-ethylhexyl group, a n-octyl group, a 2-adamantyl group and a (2-adamantyl)methyl group. In any of these groups, the carbon number is preferably not less than 1 and not more than 12 and is more preferably not less than 1 and not more than 10.

Furthermore, in the polymer compound including the unit represented by the general formula of Chemical Formula 17, the fluoridated alkyl group may be any of the aforementioned alkyl groups in which fluorine atoms are substituted for part or whole of hydrogen atoms, and specific examples are a trifluoromethyl group, a 2,2,2-trifluoroethyl group, a 3,3,3-trifluoropropyl group, a 1,1,1,3,3,3-hexafluoroisopropyl group, a 1,1,2,2,3,3,3-heptafluoropropyl group, and groups represented by respective general formulas shown in Chemical Formula 21 below.

Chemical Formula 21:

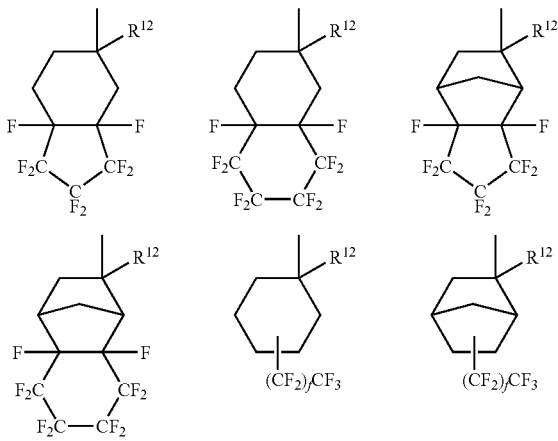

wherein $R^{12}$ is a hydrogen atom, a fluorine atom, a straight-chain alkyl group, a branched or cyclic alkyl group or a fluoridated alkyl group with a carbon number not less than 1 and not more than 20, and f is an integer not less than 0 and not more than 10.

Now, the protecting group released by an acid (that is, $R^5$) used in the polymer compound including the unit represented by the general formula of Chemical Formula 17 will be described. As the protecting group, any of various groups can be used and in particular, a group represented by a general formula of Chemical Formula 22, 23 or 24 below is preferably used.

Chemical Formula 22:

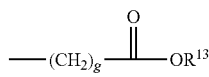

Chemical Formula 23:

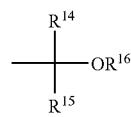

Chemical Formula 24:

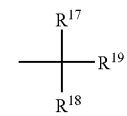

The general formula shown as Chemical Formula 22 will now be described.

In Chemical Formula 22, $R^{13}$ is a tertiary alkyl group with a carbon number not less than 4 and not more than 20 and preferably not less than 4 and not more than 15, an oxoalkyl group with a carbon number not less than 4 and not more than 20, or a group represented by Chemical Formula 24. Specific examples of the tertiary alkyl group are a tert-butyl group, a tert-amyl group, a 1,1-diethylpropyl group, a 1-ethylcyclopentyl group, a 1-butylcyclopentyl group, a 1-ethylcyclohexyl group, a 1-butylcyclohexyl group, a 1-ethyl-2-cyclopentenyl group, a 1-ethyl-2-cyclohexenyl group, a 2-methyl-2-adamantyl group, etc. Specific examples of the oxoalkyl group are a 3-oxocyclohexyl group, a 4-methyl-2-oxooxane-4-il group and a 5-methyl-5-oxooxolane-4-il group. Also, g is an integer not less than 0 and not more than 6.

Specific examples of the protecting group represented by Chemical Formula 22 are a tert-butoxycarbonyl group, a tert-butoxycarbonylmethyl group, a tert-amyloxycarbonyl group, a tert-amyloxycarbonylmethyl group, a 1,1-diethylpropyloxycarbonyl group, a 1,1-diethylpropyloxycarbonylmethyl group, a 1-ethylcyclopentyloxycarbonyl group, a 1-ethylcyclopentyloxycarbonylmethyl group, a 1-ethyl-2-cyclopentenyloxycarbonyl group, a 1-ethyl-2-cyclopentenyloxycarbonylmethyl group, a 1-ethoxyethoxycarbonylmethyl group, a 2-tetrahydropyranyloxycarbonylmethyl group, a 2-tetrahydrofuranyloxycarbonylmethyl group, etc.

Now, the general formula shown as Chemical Formula 23 will be described.

In Chemical Formula 23, $R^{14}$ and $R^{15}$ are the same or different and are a hydrogen atom, a straight-chain alkyl group or a branched or cyclic alkyl group with a carbon number not less than 1 and not more than 18 and preferably not less than 1 and not more than 10. Specific examples are a methyl group, an ethyl group, a propyl group, an isopropyl group, a n-butyl group, a sec-butyl group, a tert-butyl group, a cyclopentyl group, a cyclohexyl group, a 2-ethylhexyl group and a n-octyl group.

Furthermore, in Chemical Formula 23, $R^{16}$ is a univalent carbon hydride group (which may include a hetero atom such as an oxygen atom) with a carbon number not less than 1 and not more than 18 and preferably not less than 1 and not more than 10, and may be a straight-chain, branched or cyclic alkyl group, or such an alkyl group in which hydroxyl groups, alkoxy groups, oxo groups, amino groups or alkylamino groups are substituted for part of hydrogen atoms. Specific examples of $R^{16}$ are substituted alkyl groups shown in Chemical Formula 25 below.

Chemical Formula 25:

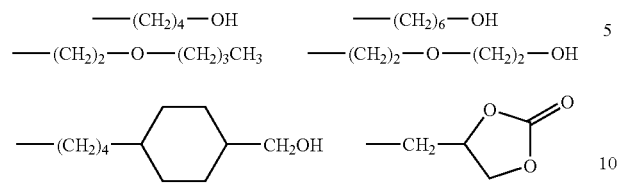

In Chemical Formula 23, each of pairs of $R^{14}$ and $R^{15}$, $R^{14}$ and $R^{16}$, and $R^{15}$ and $R^{16}$ may be mutually bonded to form a ring. When they form a ring, each of $R^{14}$, $R^{15}$ and $R^{16}$ is a straight-chain or branched alkylene group with a carbon number not less than 1 and not more than 18 and preferably not less than 1 and not more than 10.

In the protecting group represented by Chemical Formula 23, specific examples of the straight-chain or branched alkylene group are groups shown in Chemical Formula 26 below. Among these groups, an alkoxyethyl group or an alkoxymethyl group are preferred. Also, examples of the alkoxyethyl group are an adamantyloxyethyl group, a t-butyloxyethyl group, an ethoxyethyl group and a methoxymethyl group. Examples of the alkoxymethyl group are an adamantyloxymethyl group, a t-butyloxymethyl group, an ethoxymethyl group and a methoxymethyl group.

Chemical Formula 26:

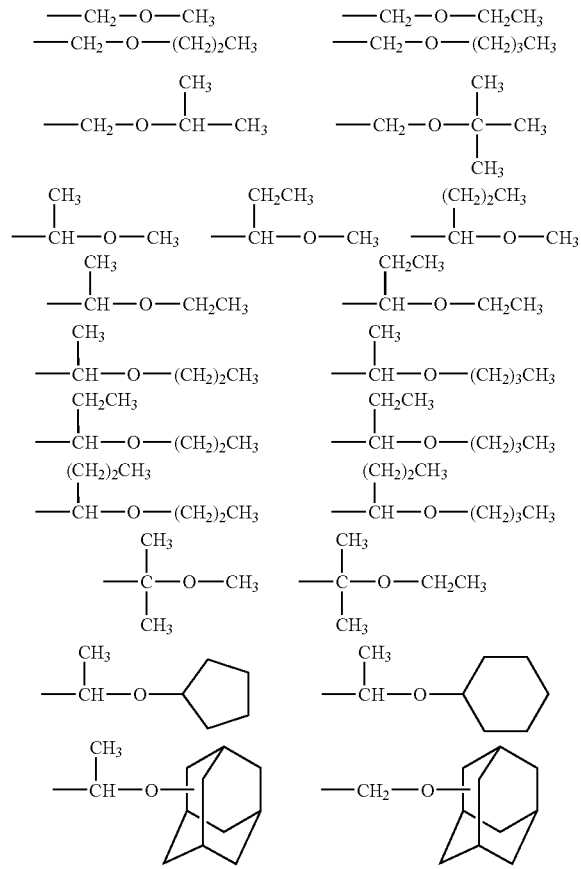

Also, in the protecting group represented by Chemical Formula 23, specific examples of the cyclic alkylene group are a tetrahydrofuran-2-il group, a 2-methyltetrahydrofuran-2-il group, a tetrahydropyran-2-il group and a 2-methyltetrahydropyran-2-il group.

Now, the general formula shown as Chemical Formula 24 will be described.

In Chemical Formula 24, each of $R^{17}$, $R^{18}$ and $R^{19}$ is a univalent carbon hydride group such as a straight-chain alkyl group or a branched or cyclic alkyl group with a carbon number not less than 1 and not more than 20, and may include a hetero atom such as oxygen, sulfur, nitrogen or fluorine.

In Chemical Formula 24, each of pairs of $R^{17}$ and $R^{18}$, $R^{17}$ and $R^{19}$, and $R^{18}$ and $R^{19}$ may be mutually bonded to form a ring together with a carbon atom bonded to these groups.

Specific examples of a tertiary alkyl group represented by Chemical Formula 24 are a tert-butyl group, a triethylcarbyl group, a 1-ethylnorbornyl group, a 1-methylcyclohexyl group, a 1-ethylcyclopentyl group, a 2-(2-methyl)adamantyl group, a 2-(2-ethyl)adamantyl group, a tert-amyl group, a 1,1,1,3,3,3-hexafluoro-2-methyl-isopropyl group, a 1,1,1,3,3,3-hexafluoro-2-cyclohexyl-isopropyl group and groups shown in Chemical Formula 27 below.

Chemical Formula 27:

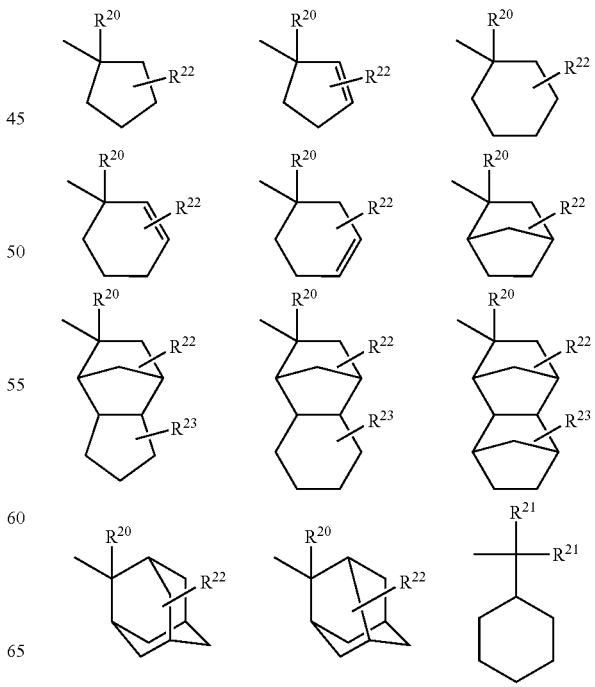

-continued

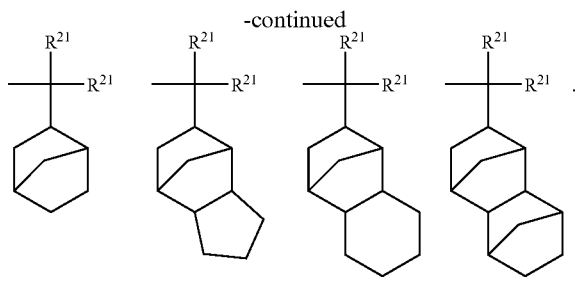

In Chemical Formula 27, $R^{20}$ is a straight-chain, branched or cyclic alkyl group with a carbon number not less than 1 and not more than 6, and specific examples are a methyl group, an ethyl group, a propyl group, an isopropyl group, a n-butyl group, a sec-butyl group, a n-pentyl group, a n-hexyl group, a cyclopropyl group, a cyclopropylmethyl group, a cyclobutyl group, a cyclopentyl group and a cyclohexyl group.

Also, in Chemical Formula 27, $R^{21}$ is a straight-chain, branched or cyclic alkyl group with a carbon number not less than 2 and not more than 6, and specific examples are an ethyl group, a propyl group, an isopropyl group, a n-butyl group, a sec-butyl group, a n-pentyl group, a n-hexyl group, a cyclopropyl group, a cyclopropylmethyl group, a cyclobutyl group, a cyclopentyl group and a cyclohexyl group.

Furthermore, in Chemical Formula 27, $R^{22}$ and $R^{23}$ are the same or different and are a hydrogen atom or a univalent carbon hydride group (which may include a hetero atom or may be bonded through a hetero atom) with a carbon number not less than 1 and not more than 6, and may be any of straight-chain, branched and cyclic groups. In this case, examples of the hetero atom are an oxygen atom, a sulfur atom, a nitrogen atom, —OH, —$OR^{24}$, —O—, —S—, —S(=O)—, —$NH_2$, —$NHR^{24}$, —$N(R^{24})_2$, —NH— and —$NR^{24}$—, wherein $R^{24}$ is an alkyl group.

Specific examples of $R^{22}$ and $R^{23}$ used in Chemical Formula 27 are a methyl group, a hydroxymethyl group, an ethyl group, a hydroxyethyl group, a propyl group, an isopropyl group, a n-butyl group, a sec-butyl group, a n-pentyl group, a n-hexyl group, a methoxy group, a methoxymethoxy group, an ethoxy group and a tert-butoxy group.

Embodiment 2

A pattern formation method according to Embodiment 2 of the invention will now be described.

In the pattern formation method of Embodiment 2, the resist material according to Embodiment 1 is used, and the pattern formation method includes the following procedures:

First, the resist material according to Embodiment 1 is applied on a substrate such as a silicon wafer in a thickness of 0.1 through 1.0 μm by spin coating or the like. Thereafter, the resultant substrate is subjected to pre-bake by using a hot plate at a temperature of 60 through 200° C. for 10 seconds through 10 minutes and preferably at a temperature of 80 through 150° C. for 30 seconds through 5 minutes. Thus, a resist film is formed.

Next, the resist film is irradiated through a photomask having a desired pattern with high energy beams such as deep UV, excimer laser or X-rays, or electron beams at exposure of approximately 1 through 200 mJ/cm² and preferably approximately 10 through 100 mJ/cm². Thereafter, the resultant is subjected to post-exposure bake (PEB) by using a hot plate at a temperature of 60 through 150° C. for 10 seconds through 5 minutes and preferably at a temperature of 80 through 130° C. for 30 seconds through 3 minutes.

Next, the resultant resist film is developed by using a developer of an alkaline aqueous solution, such as tetramethylammonium hydroxide (TMAH), with a concentration of 0.1 through 5% and preferably 2 through 3% for 10 seconds through 3 minutes and preferably 30 seconds through 2 minutes. Thus, a resist pattern is formed. For this development, any of known methods such as a dip method, a puddle method and a spray method can be employed.

In Embodiment 2, the exposing light may be deep UV or excimer laser of a wavelength of a 254 nm through 120 nm band, and in particular, high energy beams such as KrF laser of a wavelength of a 248 nm band, ArF laser of a wavelength of a 193 nm band, $F_2$ laser of a wavelength of a 157 nm band, $Kr_2$ laser of a wavelength of a 146 nm band, KrAr laser of a wavelength of a 134 nm band, $Ar_2$ laser of a wavelength of a 126 nm band or soft X-rays, or electron beams. Thus, a fine resist pattern can be formed.

Now, specific experimental examples practiced for evaluating the pattern formation method of Embodiment 2 will be described with reference to FIG. 3.

Figure 3:
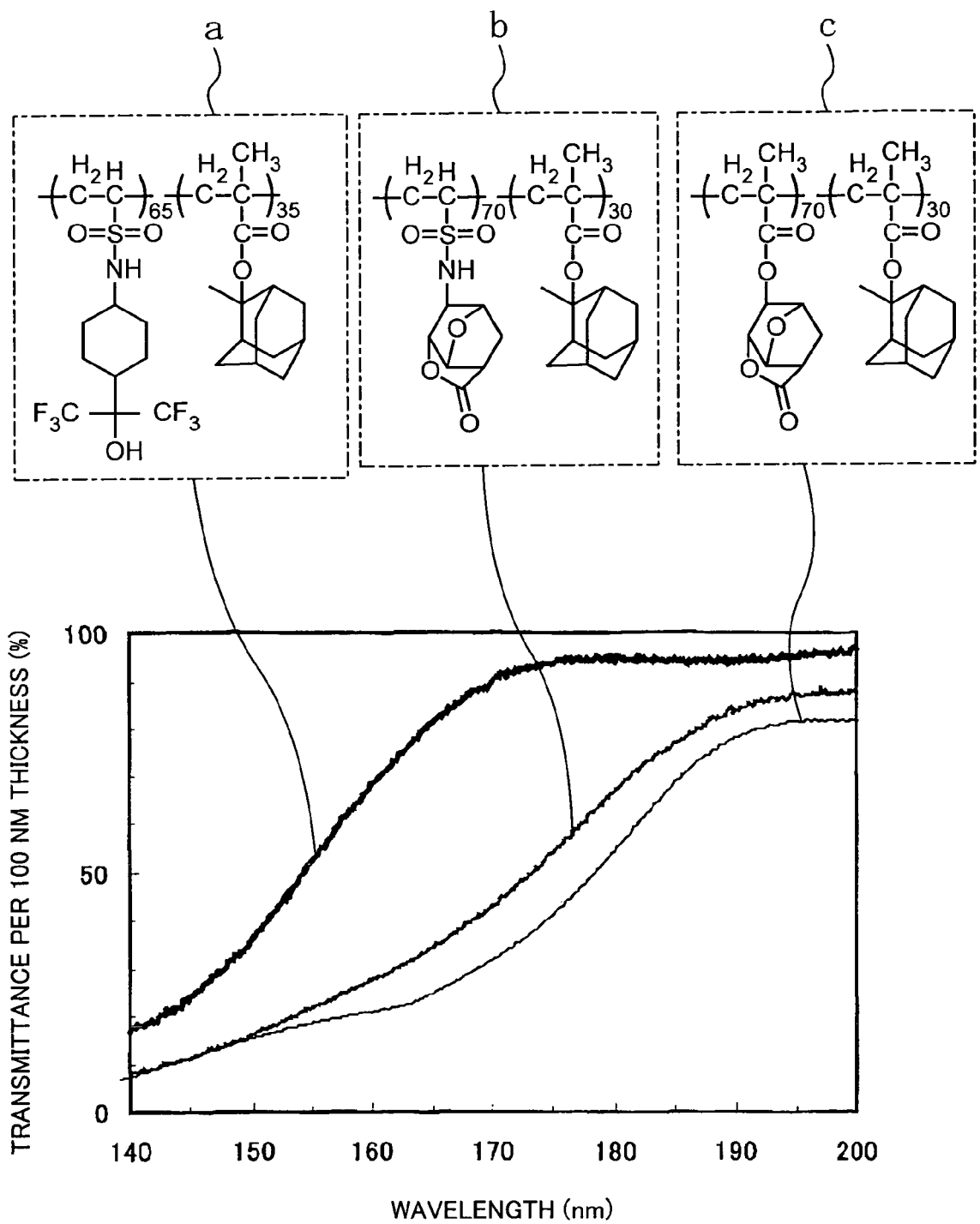
FIG. 3 is a diagram for showing an exemplified experiment performed for evaluating the pattern formation methods according to Embodiments 2 and 3.

In FIG. 3, the abscissa indicates the wavelength region of exposing light from 140 nm to 200 nm, and the ordinate indicates the transmittance (%) of the exposing light against per 100 nm thickness of a resist from 0% through 100%. Herein, three kinds of base polymers respectively having different basic skeletons are examined, and change of the transmittance in accordance with the wavelength of the exposing light is shown.

As is understood from FIG. 3, in the pattern formation method of Embodiment 2, the transmittance is improved when a unit having a vinyl sulfonamide group on a side chain is introduced as the base polymer as shown in a broken line box a or b than when an acrylic resin skeleton is used as the base polymer as shown in a broken line box c. Specifically, a difference between the unit shown in the broken line box b and the unit shown in the broken line box c is that a sulfonamide group is present on a side chain of the unit shown in the broken line box b but an ester group is present in a corresponding portion of the unit shown in the broken line box c. At this point, it is understood that the transmittance of the exposing light is higher wholly in a wavelength region beyond 150 nm when the resist material includes the unit shown in the broken line box b than when the resist material includes the unit shown in the broken line box c. Also, the transmittance of the resist material including the unit shown in the broken line box a and that of the resist material including the unit shown in the broken line box b are also largely different, and a difference in the structure between these units is a difference in the structure of the side chain bonded to the vinyl sulfonamide group. The unit shown in the broken line box a has a substituent group in which a trifluoromethyl group is substituted for cyclohexane. On the other hand, the unit shown in the broken line box b has a substituent group including an alicyclic compound. The resist material including the unit shown in the broken line box a exhibits higher transmittance than the resist material including the unit shown in the broken line box b and the resist material including the unit shown in the broken line box c wholly in a wavelength region from 140 nm to 200 nm. In particular, the transmittance is abruptly increased in a wavelength region from 150 nm to 170 nm, and transmittance of 90% or more is exhibited when the wavelength of the exposing light is 170 nm or more. The transmittance of the unit shown in the broken line box a is largely improved probably because a cyclohexane-based substituent group has a comparatively simple stereo-chemical structure and the absorption wavelength band of the exposing light is shifted by introducing a fluorine atom.

EXAMPLE 1

Example 1 for embodying the chemically amplified resist material of Embodiment 1 and the pattern formation method of Embodiment 2 will now be described with reference to FIGS. 1A through 1D.

First, a chemically amplified resist material having the following composition is prepared:

Base polymer: polymer in which a first unit represented by Chemical Formula 28 and a second unit represented by Chemical Formula 29 are polymerized Acid generator: triphenylsulfonium nonaflate (2 wt % based on the base polymer)

Solvent: propylene glycol monomethyl ether acetate

Chemical Formula 28:

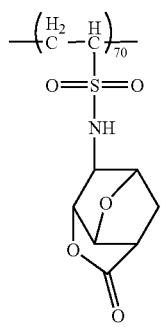

Chemical Formula 29:

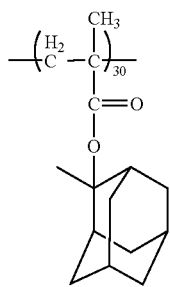

Next, as shown in FIG. 1A, the chemically amplified resist material having the above-described composition is applied on a semiconductor substrate 10 by spin coating, thereby forming a resist film 11 with a thickness of 0.2 μm. At this point, since the base polymer is alkali-insoluble, the resist film 11 is alkali-insoluble.

Figure 1B:
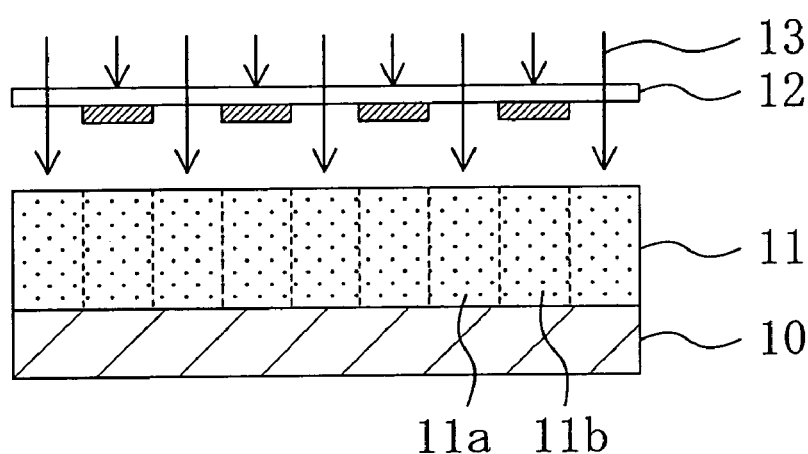

Next, as shown in FIG. 1B, the resist film 11 is subjected to pattern exposure by irradiating through a mask 12 with exposing light 13 of ArF laser (of a wavelength of a 193 nm band). Thus, an acid is generated from the acid generator in an exposed portion 11a of the resist film 11 while no acid is generated in an unexposed portion 11b of the resist film 11.

Figure 1C:
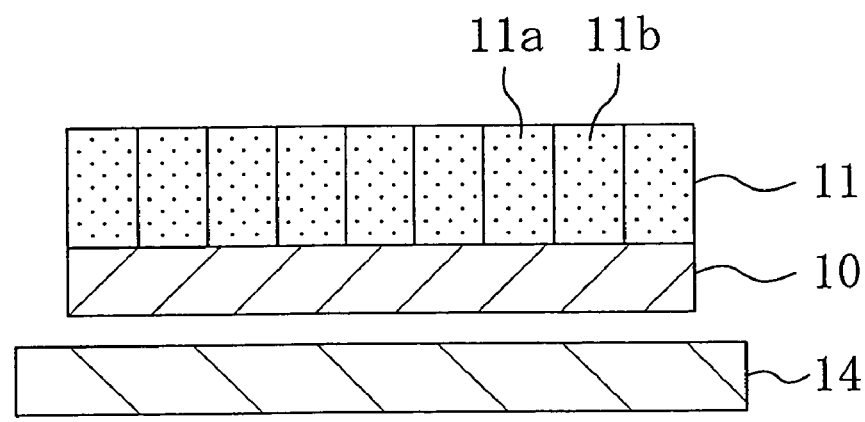

Then, as shown in FIG. 1C, the semiconductor substrate 10 together with the resist film 11 is heated with a hot plate 14. Thus, the base polymer is heated in the presence of the acid in the exposed portion 11a of the resist film 11, so as to release a protecting group in the second unit. As a result, the base polymer becomes alkali-soluble.

Figure 1D:
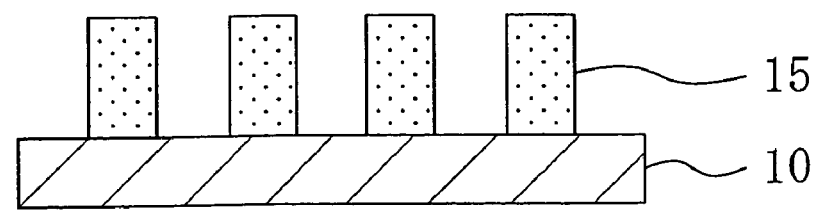

Subsequently, the resist film 11 is developed with an alkaline developer such as a tetramethylammonium hydroxide aqueous solution. Thus, the exposed portion 11a of the resist film 11 is dissolved in the developer, so that a resist pattern 15 made of the unexposed portion 11b of the resist film 11 can be formed as shown in FIG. 1D.

It is noted that the base polymer includes the unit represented by Chemical Formula 28 in a ratio of approximately 70% of the whole base polymer and the unit represented by Chemical Formula 29 in a ratio of approximately 30% of the whole base polymer.

In the case where the base polymer thus includes a plurality of units, the unit having a sulfonamide group is preferably included in a ratio of 50 through 70% of the whole base polymer. Thus, an effect to improve the transparency and the hydrophilic property owing to the sulfonamide group can be attained without canceling an effect to improve the etching resistance owing to another unit, and hence, the resist can be formed with these different effects complementing each other.

Also, when the base polymer in which the first unit represented by Chemical Formula 28 and the second unit represented by Chemical Formula 29 are polymerized as shown in the broken line box b of FIG. 3 is compared with the acrylic resin shown in the broken line box c of FIG. 3 in the transparency against the exposing light, the base polymer in which the first unit represented by Chemical Formula 28 and the second unit represented by Chemical Formula 29 are polymerized has improved transparency against exposing light of a wavelength of 160 nm through 200 nm in particular.

EXAMPLE 2

Example 2 for embodying the chemically amplified resist material according to Embodiment 1 and the pattern formation method according to Embodiment 2 will now be described. Since Example 2 is different from Example 1 merely in the chemically amplified resist material, the resist material alone will be herein described.

A chemically amplified resist material having the following composition is prepared:

Base polymer: polymer in which a first unit represented by Chemical Formula 30 and a second unit represented by Chemical Formula 31 are polymerized Acid generator: triphenylsulfonium triflate (3 wt % based on the base polymer)

Solvent: propylene glycol monomethyl ether acetate

Chemical Formula 30:

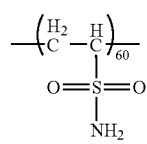

Chemical Formula 31:

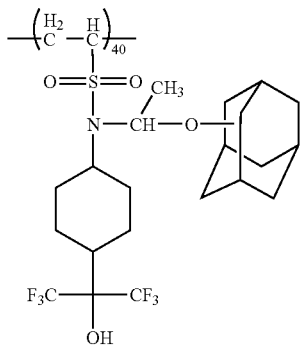

Embodiment 3

A pattern formation method according to Embodiment 3 of the invention will now be described.

In the pattern formation method of Embodiment 3, immersion lithography for performing exposure with water provided between a resist film and an exposure lens is carried out by using the resist material according to Embodiment 1. This pattern formation method includes the following procedures:

First, the resist material according to Embodiment 1 is applied on a substrate such as a silicon wafer in a thickness of 0.1 through 1.0 μm by spin coating or the like. Thereafter, the resultant substrate is subjected to pre-bake by using a hot plate at a temperature of 60 through 200° C. for 10 seconds through 10 minutes and preferably at a temperature of 80 through 150° C. for 30 seconds through 5 minutes. Thus, a resist film is formed.

Next, with a liquid supplied on the resist film, the resist film is irradiated through a photomask having a desired pattern with high energy beams such as deep UV, excimer laser or X-rays, or electron beams at exposure of approximately 1 through 200 mJ/cm$^2$ and preferably approximately 10 through 100 mJ/cm$^2$.

Thereafter, the resultant is subjected to post-exposure bake (PEB) by using a hot plate at a temperature of 60 through 150° C. for 10 seconds through 5 minutes and preferably at a temperature of 80 through 130° C. for 30 seconds through 3 minutes.

Next, the resultant resist film is developed by using a developer of an alkaline aqueous solution, such as tetramethylammonium hydroxide (TMAH), with a concentration of 0.1 through 5% and preferably 2 through 3% for 10 seconds through 3 minutes and preferably 30 seconds through 2 minutes. Thus, a resist pattern is formed. For this development, any of known methods such as a dip method, a puddle method and a spray method can be employed.

In Embodiment 3, the exposing light may be deep UV or excimer laser of a Wavelength of a 254 nm through 120 nm band, and in particular, high energy beams such as KrF laser of a wavelength of a 248 nm band, ArF laser of a wavelength of a 193 nm band, F$_2$ laser of a wavelength of a 157 nm band, Kr$_2$ laser of a wavelength of a 146 nm band, KrAr laser of a wavelength of a 134 nm band, Ar$_2$ laser of a wavelength of a 126 nm band or soft X-rays, or electron beams. Thus, a fine resist pattern can be formed.

Apart from water, a liquid (having a refractive index n) such as perfluoropolyether may be supplied on the resist film 11 in the pattern exposure for selectively irradiating the resist film with the exposing light. When such immersion lithography is performed, since a region between a condensing lens and the resist film in an exposure system is filled with the liquid having a refractive index n, the value of NA (numerical aperture) of the exposure system becomes a value n·NA, and hence, the resolution of the resist film is improved.

Now, specific experimental examples practiced for evaluating the pattern formation method of Embodiment 3 will be described with reference to FIG. 3.

In FIG. 3, the abscissa indicates the wavelength region of exposing light from 140 nm to 200 nm, and the ordinate indicates the transmittance (%) of the exposing light against per 100 nm thickness of a resist from 0% through 100%. Herein, three kinds of base polymers respectively having different basic skeletons are examined, and change of the transmittance in accordance with the wavelength of the exposing light is shown.

As is understood from FIG. 3, in the pattern formation method of Embodiment 3, the transmittance is improved when a unit having a vinyl sulfonamide group on a side chain is introduced as the base polymer as shown in the broken line box a or b than when an acrylic resin skeleton is used as the base polymer as shown in the broken line box c. The transparency similar to that attained in Embodiment 2 is obtained in this embodiment because the liquid used in the immersion lithography has a very low characteristic to absorb the exposing light and hence does not largely affect the transparency against the exposing light. In other words, even when a liquid with a large refractive index is provided between the resist film and the lens, the transparency against the exposing light depends upon the characteristic of the resist itself.

EXAMPLE 3

Example 3 for embodying the chemically amplified resist material according to Embodiment 1 and the pattern formation method according to Embodiment 3 will now be described with reference to FIGS. 2A through 2D.

First, a chemically amplified resist material having the following composition is prepared:

Base polymer: polymer in which a first unit represented by Chemical Formula 32 and a second unit represented by Chemical Formula 33 are polymerized Acid generator: triphenylsulfonium triflate (2 wt % based on the base polymer)

Solvent: propylene glycol monomethyl ether acetate

Chemical Formula 32:

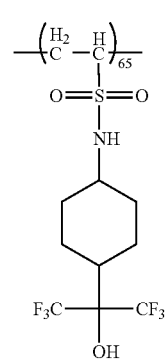

Chemical Formula 33:

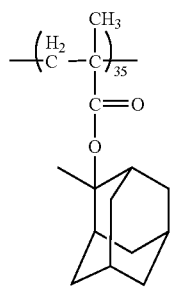

Figure 2A:
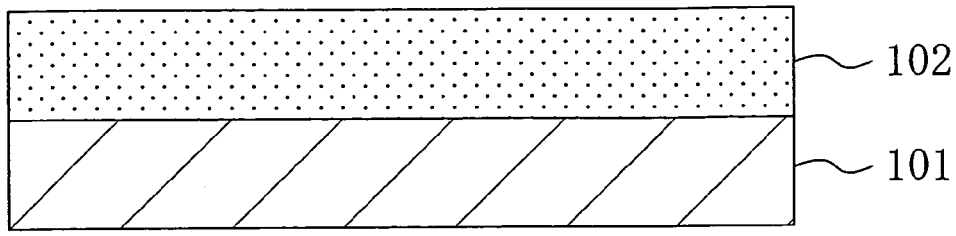
FIGS. 2A, 2B, 2C and 2D are cross-sectional views for showing procedures in a pattern formation method of Example 3 for embodying Embodiment 3 of the invention.

Next, as shown in FIG. 2A, the chemically amplified resist material having the above-described composition is applied on a semiconductor substrate 101 by spin coating, thereby forming a resist film 102 with a thickness of 0.2 μm. At this point, since the base polymer is alkali-insoluble, the resist film 102 is alkali-insoluble.

Figure 2B:
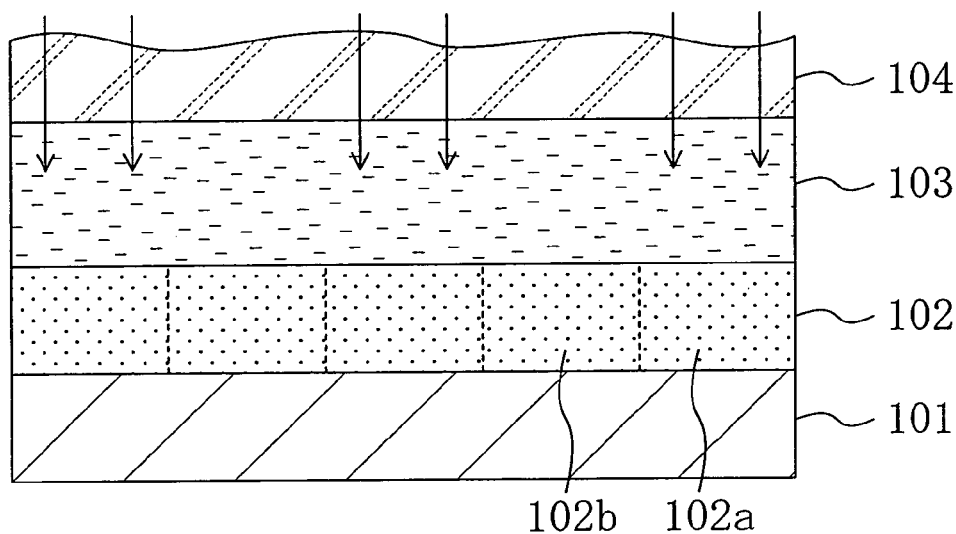

Next, as shown in FIG. 2B, the resist film 102 is subjected to pattern exposure by irradiating through an exposure lens 104 with exposing light of ArF laser (of a wavelength of a 193 nm band) with water 103 (having a refractive index n of 1.44) provided on the resist film 102. Thus, an acid is generated from the acid generator in an exposed portion 102a of the resist film 102 while no acid is generated in an unexposed portion 102b of the resist film 102.

Figure 2C:
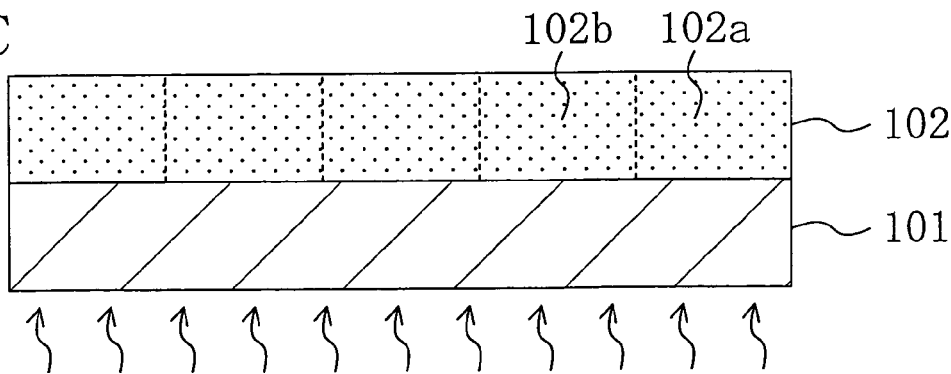

Then, as shown in FIG. 2C, the semiconductor substrate 101 together with the resist film 102 is heated with a hot plate. Thus, the base polymer is heated in the presence of the acid in the exposed portion 102a of the resist film 102, so as to release a protecting group in the second unit. As a result, the base polymer becomes alkali-soluble.

Figure 2D:
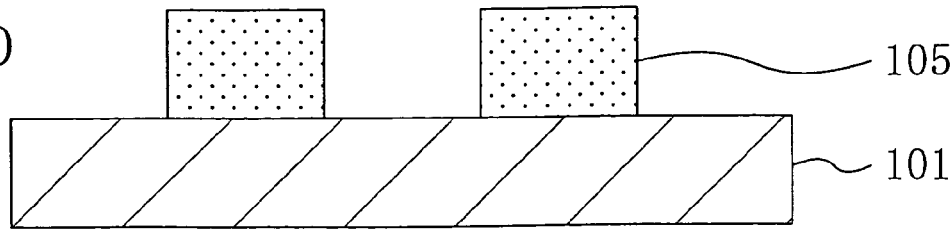

Subsequently, the resist film 102 is developed with an alkaline developer such as a tetramethylammonium hydroxide aqueous solution. Thus, the exposed portion 102a of the resist film 102 is dissolved in the developer, so that a resist pattern 105 made of the unexposed portion 102b of the resist film 102 can be formed as shown in FIG. 2D.

When the base polymer in which the first unit represented by Chemical Formula 32 and the second unit represented by Chemical Formula 33 are polymerized as shown in the broken line box a of FIG. 3 is compared with the acrylic resin shown in the broken line box c of FIG. 3 in the transparency against the exposing light, the base polymer in which the first unit represented by Chemical Formula 32 and the second unit represented by Chemical Formula 33 are polymerized has largely improved transparency against the exposing light of a wavelength of 150 nm through 200 nm in particular. This is because a plurality of fluorine atoms are included in a terminal portion of the side chain in the broken line box a of FIG. 3 as represented by Chemical Formula 32 and hence the original absorption peak of the compound can be largely shifted. Accordingly, since a sufficient amount of acid is generated in the exposed portion in the exposure, the solubility in the developer can be improved and a large difference can be caused in the reactivity between the exposed portion and the unexposed portion, so as to improve the contrast of the resist pattern.

It is noted that the base polymer includes the first unit represented by Chemical Formula 32 in a ratio of approximately 65% of the whole base polymer and the second unit represented by Chemical Formula 33 in a ratio of approximately 35% of the whole base polymer.

In the case where the base polymer includes a plurality of kinds of units in this manner, the respective units are preferably polymerized in a comparatively homogeneous state. If one of the plural kinds of units is continuously polymerized in a given portion, the polymerization balance of the whole base polymer is degraded. Therefore, when the different units are well mixed in the base polymer by preventing a given unit from polymerizing locally in a given portion of the base polymer, the balance in the whole polymer can be improved. Also, since the respective units can be polymerized in such a manner as to be engaged with one another, the skeleton strength of the resultant base polymer can be improved. Therefore, the effect to improve the transparency and the hydrophilic property owing to the sulfonamide group can be attained, and in addition, the etching resistance is improved. In other words, when a base polymer including at least two kinds of units and having high polymerization uniformity is provided, the etching resistance can be improved so that a resist pattern can be formed in a good shape.

In addition, when the polymerization uniformity of the units used for forming a resist film is improved, particularly in employing the exposure by the immersion lithography, permeation of an immersion liquid into the resist film and elution of components of the resist film into the immersion liquid can be suppressed. This is because, when the polymerization uniformity is high, different kinds of units are engaged with one another so as to be sterically bonded to one another in a resultant polymer structure, and hence, the structure of the resultant resist film is complicated. Accordingly, even in the exposure by the immersion lithography in which the immersion liquid and the resist film are in direct contact with each other, the elution of a resist component into the liquid and the mixture of the immersion liquid with a resist component can be prevented. As a result, a pattern can be accurately formed.

The resist material or the pattern formation method of this invention is particularly suitable to a method for forming a fine resist pattern in a shape vertical to a substrate by using exposing light of KrF laser, ArF laser, $F_2$ laser, KrAr laser or $Ar_2$ laser.

What is claimed is:

1. A resist material comprising a base polymer containing a compound including a unit represented by a general formula of the following Chemical Formula 1:

Chemical Formula 1:

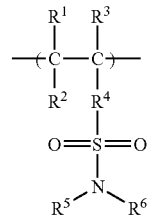

wherein $R^1$, $R^2$ and $R^3$ are the same or different and are a hydrogen atom, a fluorine atom, a straight-chain alkyl group, a branched or cyclic alkyl group or a fluoridated alkyl group with a carbon number not less than 1 and not more than 20; $R^4$ is a straight-chain alkylene group or a branched or cyclic alkylene group with a carbon number not less than 0 and not more than 20; $R^5$ is a hydrogen atom, a straight-chain alkyl group, a branched or cyclic alkyl group or a fluoridated alkyl group with a carbon number not less than 1 and not more than 20, or a protecting group released by an acid; and $R^6$ is a group having a cyclic ester compound or a group having a compound including hexafluoroisopropyl alcohol, wherein said group having a cyclic ester compound includes a unit represented by any of general formulas of the following Chemical Formula 2:

Chemical Formula 2:

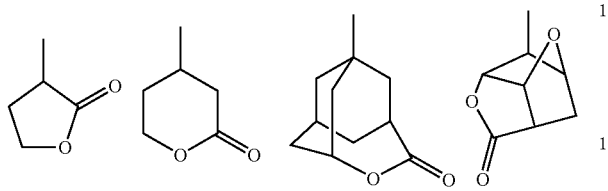

and wherein said group having a compound including hexafluoroisopropyl alcohol includes a unit represented by any of general formulas of following Chemical Formula 4:

Chemical Formula 4:

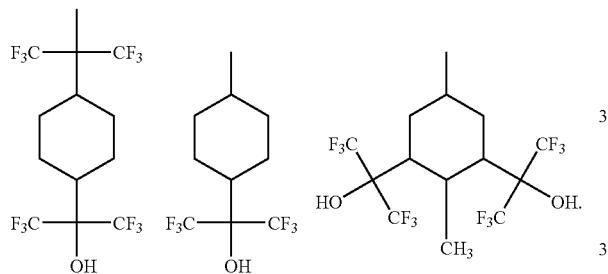

2. The resist material of claim 1,
wherein said base polymer further includes an acid generator for generating an acid through irradiation with light.
3. The resist material of claim 2,
wherein said base polymer further includes a dissolution inhibitor for inhibiting dissolution of said base polymer.
4. The resist material of claim 1,
wherein said protecting group released by an acid is an acetal group.
5. The resist material of claim 4,
wherein said acetal group is an alkoxyethyl group or an alkoxymethyl group.
6. The resist material of claim 5,
wherein said alkoxyethyl group is an adamantyloxyethyl group, a t-butyloxyethyl group, an ethoxyethyl group or a methoxyethyl group, and
said alkoxymethyl group is an adamantyloxymethyl group, a t-butyloxymethyl group, an ethoxymethyl group or a methoxymethyl group.
7. A pattern formation method comprising the steps of:
forming a resist film containing a base polymer including a compound having a unit represented by a general formula of the following Chemical Formula 5;
performing pattern exposure by selectively irradiating said resist film with exposing light of high energy beams of a wavelength not shorter than a 100 nm band and not longer than a 300 nm band or not shorter than a 1 nm band and not longer than a 30 nm band or electron beams; and forming a resist pattern by developing said resist film after the pattern exposure:

Chemical Formula 5:

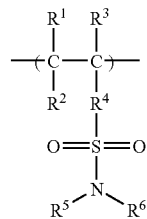

wherein $R^1$, $R^2$ and $R^3$ are the same or different and are a hydrogen atom, a fluorine atom, a straight-chain alkyl group, a branched or cyclic alkyl group or a fluoridated alkyl group with a carbon number not less than 1 and not more than 20; $R^4$ is a straight-chain alkylene group or a branched or cyclic alkylene group with a carbon number not less than 0 and not more than 20; $R^5$ is a hydrogen atom, a straight-chain alkyl group, a branched or cyclic alkyl group or a fluoridated alkyl group with a carbon number not less than 1 and not more than 20, or a protecting group released by an acid; and $R^6$ a group having a cyclic ester compound or a group having a compound including hexafluoroisopropyl alcohol, wherein said group having a cyclic ester compound includes a unit represented by any of general formulas of the following Chemical Formula 6:

Chemical Formula 6:

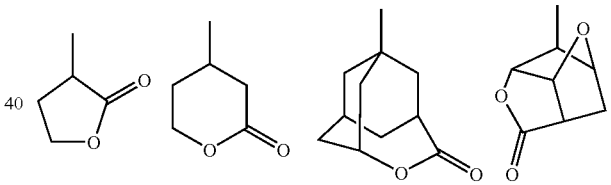

and wherein said group having a compound including hexafluoroisopropyl alcohol includes a unit represented by any of general formulas of the following Chemical Formula 8:

Chemical Formula 8:

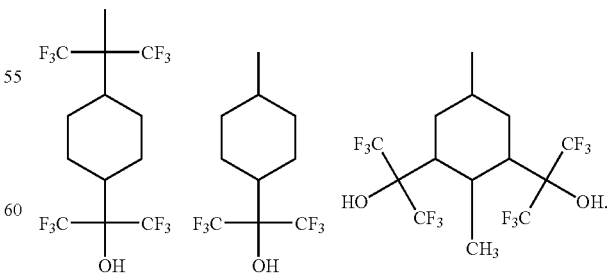

8. The pattern formation method of claim 7,
wherein said base polymer further includes an acid generator for generating an acid through irradiation with light.

9. The pattern formation method of claim 7,
wherein said protecting group released by an acid is an acetal group.

10. The pattern formation method of claim 7,
wherein said exposing light is KrF laser, ArF laser, $F_2$ laser, $Kr_2$ laser, KrAr laser, $Ar_2$ laser or soft X-rays.

11. The pattern formation method of claim 7,
wherein said base polymer has a trifluoromethyl group on a side chain thereof.

12. A pattern formation method comprising the steps of:
forming a resist film containing a base polymer including a compound having a unit represented by a general formula of the following Chemical Formula 9;
providing a liquid onto said resist film;
performing pattern exposure by selectively irradiating said resist film with exposing light of high energy beams of a wavelength not shorter than a 100 nm band and not longer than a 300 nm band or not shorter than a 1 nm band and not longer than a 30 nm band or electron beams; and
forming a resist pattern by developing said resist film after the pattern exposure:

Chemical Formula 9:

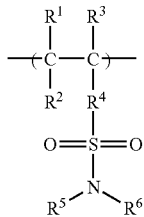

wherein $R^1$, $R^2$ and $R^3$ are the same or different and are a hydrogen atom, a fluorine atom, a straight-chain alkyl group, a branched or cyclic alkyl group or a fluoridated alkyl group with a carbon number not less than 1 and not more than 20; $R^4$ is a straight-chain alkylene group or a branched or cyclic alkylene group with a carbon number not less than 0 and not more than 20; $R^5$ is a hydrogen atom, a straight-chain alkyl group, a branched or cyclic alkyl group or a fluoridated alkyl group with a carbon number not less than 1 and not more than 20, or a protecting group released by an acid; and $R^6$ is a group having a cyclic ester compound or a group having a compound including hexafluoroisopropyl alcohol, wherein said group having a cyclic ester compound includes a unit represented by any of general formulas of the following Chemical Formula 10:

Chemical Formula 10:

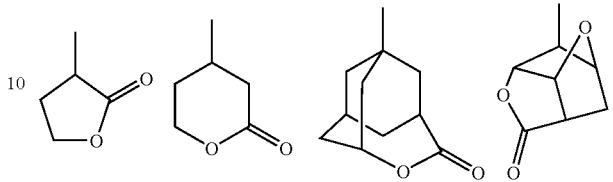

and wherein said group having a compound including hexafluoroisopropyl alcohol includes a unit represented by any of general formulas of the following Chemical Formula 12:

Chemical Formula 12:

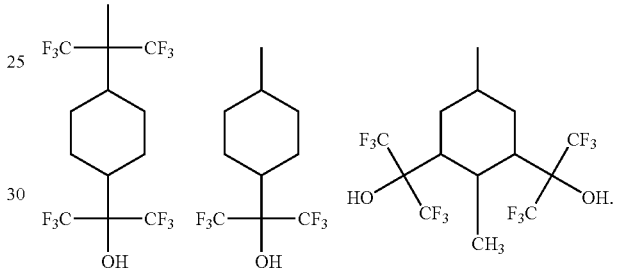

13. The pattern formation method of claim 12,
wherein said base polymer further includes an acid generator for generating an acid through irradiation with light.

14. The pattern formation method of claim 12,
wherein said protecting group released by an acid is an acetal group.

15. The pattern formation method of claim 12,
wherein said liquid is water or perfluoropolyether.

16. The pattern formation method of claim 12,
wherein said exposing light is KrF laser, ArF laser, $F_2$ laser, $Kr_2$ laser, KrAr laser, $Ar_2$ laser or soft X-rays.

17. The pattern formation method of claim 12,
wherein said base polymer has a trifluoromethyl group on a side chain thereof.

* * * * *